United States Patent
Nesnidal et al.

(10) Patent No.: US 6,364,541 B1
(45) Date of Patent: Apr. 2, 2002

(54) METHOD AND APPARATUS FOR OPTICAL RECEPTION

(75) Inventors: Michael P. Nesnidal; Robert A. Marsland; Robert S. Williamson, III, all of Madison, WI (US)

(73) Assignee: New Focus, Inc., San Jose, CA (US)

( * ) Notice: Subject to any disclaimer, the term of this patent is extended or adjusted under 35 U.S.C. 154(b) by 0 days.

(21) Appl. No.: 09/552,894

(22) Filed: May 1, 2000

Related U.S. Application Data

(60) Provisional application No. 60/174,038, filed on Dec. 30, 1999, provisional application No. 60/171,933, filed on Dec. 22, 1999, and provisional application No. 60/171,927, filed on Dec. 22, 1999.

(51) Int. Cl.⁷ .................................................. G02B 6/36
(52) U.S. Cl. ........................... 385/92; 385/24; 385/88; 359/154; 359/159; 250/214.1; 257/457
(58) Field of Search .............................. 385/92, 88–94, 385/24; 359/109, 180, 189, 124, 152, 159, 154; 250/214.1, 227.11; 257/457, 459, 465

(56) References Cited

U.S. PATENT DOCUMENTS

| | | | |
|---|---|---|---|
| 3,757,123 A | | 9/1973 | Archer et. al. ............. 250/83 R |
| 5,053,837 A | | 10/1991 | Tonai ........................... 359/17 |
| 5,451,769 A | * | 9/1995 | Mc Adoo et al. ......... 250/214.1 |
| 5,777,390 A | | 7/1998 | Berger et al. ............... 257/457 |

* cited by examiner

*Primary Examiner*—Phan T. H. Palmer
(74) *Attorney, Agent, or Firm*—Conley, Rose & Tayon, PC; B. Noël Kivlin

(57) ABSTRACT

An optical receiver may include a photodector defined on a multilayer semiconductor structure. A first electrode may be formed by at least two substantially concentric conductive rings electrically coupled to one another and to a portion of a first layer of the multilayer semiconductor structure. A second electrode may be coupled to a second layer of the multilayer semiconductor structure and configured to transfer current generated by the photodetector in response to optical emissions. A method of fabricating such an optical receiver is also disclosed.

20 Claims, 12 Drawing Sheets

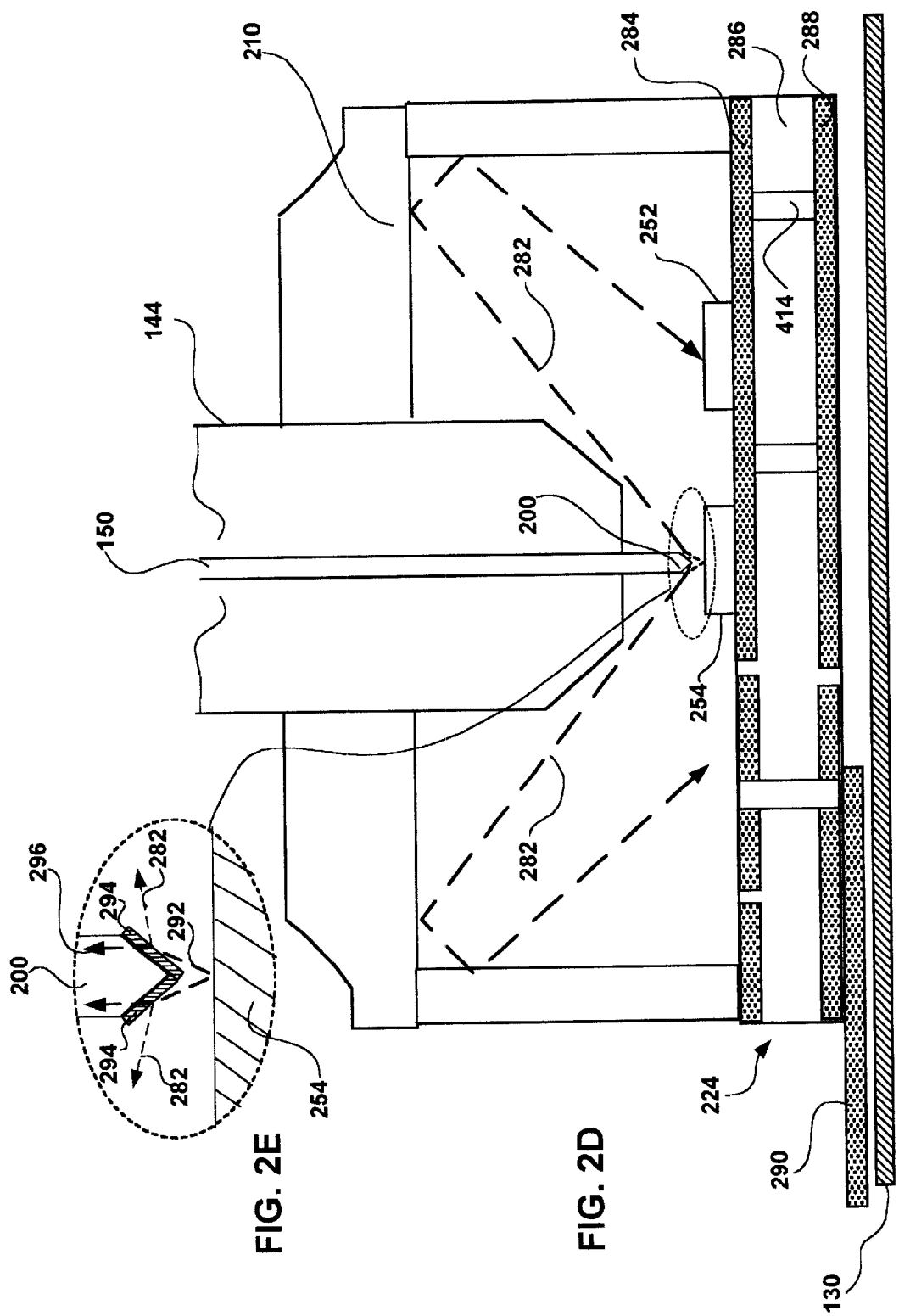

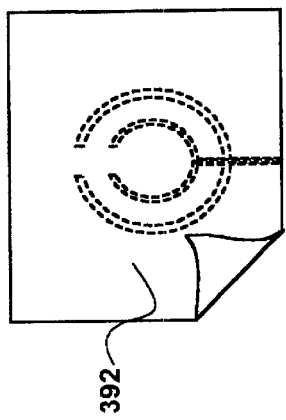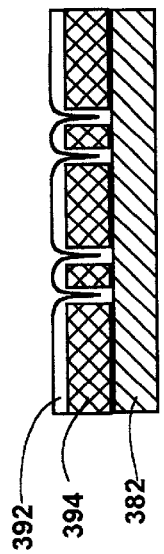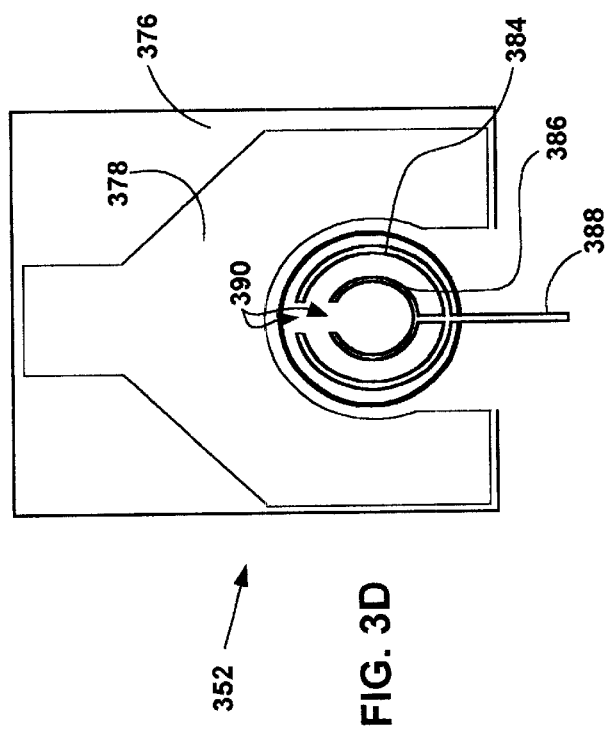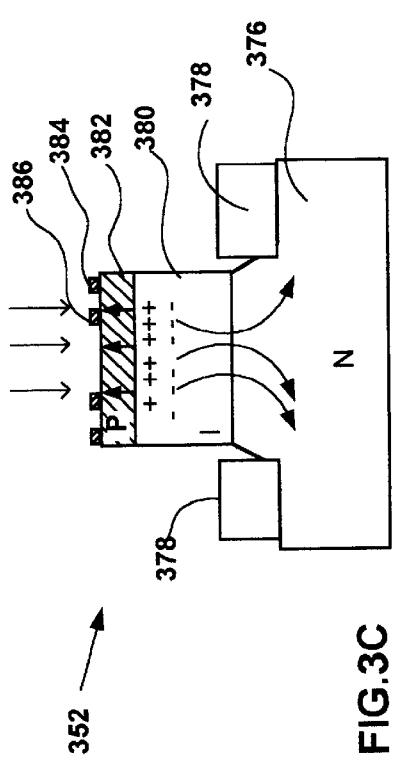

PINS

ASSEMBLY

METHOD AND APPARATUS FOR OPTICAL RECEPTION

CROSS-REFERENCE TO RELATED APPLICATION

This application claims priority from Provisional Application Numbers: 60/171,933, entitled "Method for Automatic Power Control in Fiber-Coupled VCSEL Devices" filed on Dec. 22, 1999; 60/171,927, entitled "Double-Ring Contact for High-Speed Photo Diode" filed on Dec. 22, 1999; 60/174,038, entitled "Versatile Surface Mount Optoelectronic Package with High-Performance RE Interface" filed on Dec. 30, 1999. Each of the above-cited applications is incorporated herein by reference in its entirety.

BACKGROUND OF THE INVENTION

1. Field of the Invention

This invention generally relates to optical communication systems and more particularly to an optical receiver.

2. Description of the Related Art

The telecommunications network serving the United States and the rest of the world is presently evolving from analog to digital transmission with ever increasing bandwidth requirements. Fiber optic cable has proved to be a valuable tool, replacing copper cable in nearly every application from large trunks to subscriber distribution plants. Fiber optic cable is capable of carrying much more information than copper with lower attenuation.

The T-1 standards committee of ANSI has provided a draft document, "ANSI T1.105-1988", dated Mar. 10, 1988, which sets forth specifications for rate and format of signals that are to be used in optical interfaces. The provided specifications detail the Synchronous Optical Network (SONET) standard. SONET defines a hierarchy of multiplexing levels and standard protocols which allow efficient use of the wide bandwidth of fiber optic cable, while providing a means to merge lower level DS0 and DS1 signals into a common medium. In essence, SONET established a uniform standardization transmission and signaling scheme, which provided a synchronous transmission format that is compatible with all current and anticipated signal hierarchies. Because of the nature of fiber optics, expansion of bandwidth is easily accomplished.

Currently this expansion of bandwidth is being accomplished by what is known as "wavelength division multiplexing" (WDM), in which separate subscriber/data sessions may be handled concurrently on a single optic fiber by means of modulation of each of those subscriber datastreams on different portions of the light spectrum. WDM is therefore the optical equivalent of frequency division multiplexing (FDM). Current implementations of WDM involve as many as 128 semiconductor lasers each lasing at a specific center frequency within the range of 1525–1575 nm. Each subscriber datastream is optically modulated onto the output beam of a corresponding semiconductor laser. The modulated information from each of the semiconductor lasers is combined onto a single optic fiber for transmission. As this digital signal is passed across a SONET network, it will be subject at various intervals to amplification by, for example, Erbium doped amplifiers and dispersion compensation by, for example, optical circulators with coupled Bragg filters. At each node in the network, e.g. central office or remote terminal, optical transceivers mounted on fiber line cards are provided. On the transmit side, a framer permits SONET framing, pointer generation and scrambling for transmission of data from a bank of lasers and associated drivers, with each laser radiating at a different wavelength. On the receive side, the incoming signals are separated into channels detected by photodetectors, framed and decoded.

As more and more optical signal equipment (transmitting, receiving, amplification, coherence and switching) is being designed and utilized, a need has arisen for short and intermediate range optical links to allow high speed data transfers within various components of a central office. Currently such links require the same expensive circuits and lasers used in long-range optical links. What is needed is a short- and intermediate-range high data rate optical communication system that does not require the cost and complexity of prior art devices and which preferably can be achieved with a reduced form factor compared with prior art devices.

SUMMARY OF THE INVENTION

The present invention provides a method and apparatus for reception of optical communications. The present invention provides an optical receiver that includes a feedback circuit to remove dc-offset, and an electrode structure that facilitates high frequency optical signal detection. The electrode structure is designed for ease of fabrication. These features allow the receiver to receive an optical output beam that can be modulated over a wide range of frequencies, duty cycles and amplitudes with the receiver providing very precise definition of the rising and falling edges of the information carried on that output beam. A novel transmitter for use in conjunction with the receiver is also disclosed. In combination these features result in an optical receiver or receiver/transmitter that may be fabricated with relatively low cost and a reduced form factor when compared with prior art optical receivers or receiver/transmitters.

In an embodiment of the invention the optical receiver includes a photo detector, a first electrode and a second electrode. The photo detector is defined on a multilayer semiconductor structure. The photo detector includes a first electrode formed by at least two substantially concentric conductive rings electrically coupled to one another and to a portion of a first layer of the multilayer semiconductor structure. The second electrode is coupled to a second layer of the multilayer semiconductor structure, for the transfer of a current generated by the photo detector responsive to optical emissions.

In an alternate embodiment of the invention a method for fabricating an optical receiver is disclosed. The method comprises the acts of:

providing a multilayer semiconductor structure;

forming a first electrode on a first layer of the multilayer semiconductor structure; and masking a second layer of the multilayer semiconductor structure to define within a mask at least two substantially concentric rings with a gap in a circumference of each of the at least two substantially concentric rings;

forming an electrically conductive lift off layer on the mask; and removing the lift off layer as a single sheet to form a second electrode including at least two substantially concentric conductive rings electrically coupled to one another and to a portion of the second layer of the multilayer semiconductor structure.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which:

FIG. 2D is a cross-sectional elevation showing details of the interior of the transmitter package.

FIG. 2E is an exploded cross-sectional view of the coupling between the semiconductor laser and the tip of the optic fiber.

FIG. 3C is a cross-sectional elevation showing details of the high speed photodetector in accordance with an embodiment of the current invention.

FIG. 3D is a top view of the high-speed photodetector shown in FIG. 3C.

FIG. 3E is a top view of the lift-off layer from which the upper twin concentric electrodes of the high-speed photodetector are defined.

FIG. 3F is a cross-sectional side view of the mask and lift-off layers from which the upper electrodes of the high-speed photodetector is formed.

DETAILED DESCRIPTION OF THE INVENTION

The present invention provides a method and apparatus for reception of optical is communications. The present invention provides an optical receiver that includes a feedback circuit to enhance the stability of output power levels. The receiver includes a high-speed photodetector designed to operate in the gigahertz range (1 Mhz–40 GHz). The high-speed photodetector includes an electrode structure designed for ease of fabrication. These features allow the receiver to receive an optical output beam that can be modulated over a wide range of frequencies, duty cycles and amplitudes with the receiver providing very precise definition of the rising and falling edges of the information carried on that output beam.

The receiver may be packaged on its own or with a transmitter in a novel package with radio frequency (RF) shielding for high speed electrical or opto-electronic elements. The package may be used for housing an optical transmitter and receiver combination for short and intermediate range information transfer at high data rates. This allows the transmitter, receiver, or other opto-electronic components to be placed in close proximity with other electronic components without significant RF interference. The transmitter includes a control circuit to enhance the stability of output power levels, a modulator circuit with precise impedance matching for high frequency performance, and an optical coupling mechanism that reduces the effect of optical feedback between the laser and devices coupled to the fiber. These features allow the user to transmit and receive an optical output beam which can be modulated over a wide range of frequencies (1 Mhz–40 GHz), duty cycles and amplitudes with very precise definition of the rising and falling edges of the waveform. The receiver or receiver/transmitter may be fabricated with relatively low cost and a reduced form factor when compared with prior art electrical opto-electrical receivers or receiver/transmitters.

Figure 1:
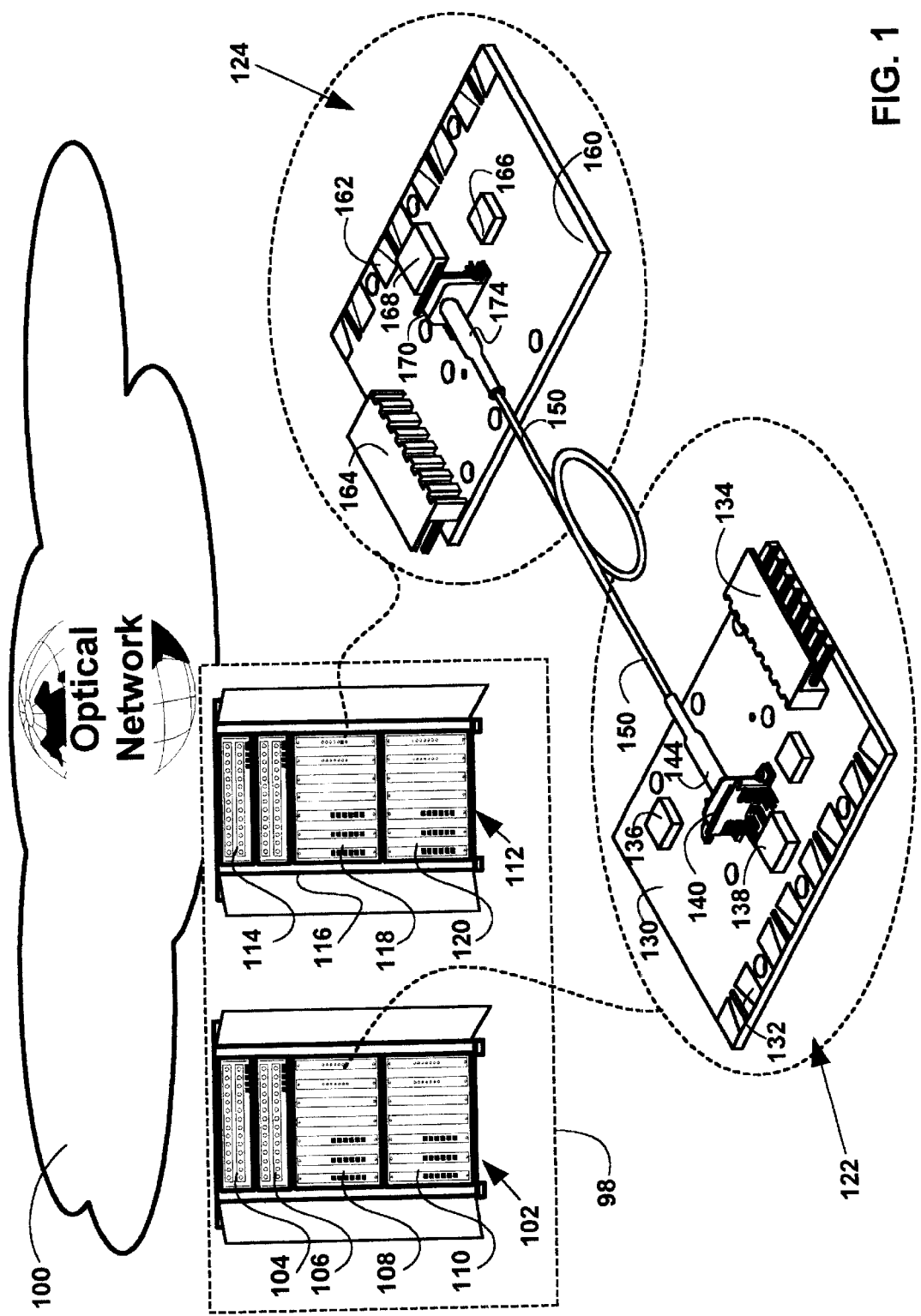
FIG. 1 shows a system diagram of an optical network including an embodiment of an optical transmitter and receiver in accordance with the current invention.

FIG. 1 shows an optical transmitter 140 and receiver 170 coupling various components which are part of an optical network 100. With the implementation of the Synchronous Optical Network (SONET), communication carriers throughout the world can interconnect their existing digital carrier and fiber optic systems. A central office/switching center 98 with a plurality of racks 102,112 are shown coupled to the optical network. Datastreams on the network are typically multiplexed using wavelength division multiplexing (WDM) in different portions of the optical spectrum. At the central office on racks 102 and 112, the line cards 108–110, 118–120 and multiplexer and demultiplexers 104–106, 114–116 respectively handle the transmission and reception of datastreams. Within a central office (CO), or in an embodiment of the invention between buildings of a CO, it will be advantageous to have inexpensive optical means for coupling various components which operate at high data rates e.g. 10 Gbit/s. Transmitter 140 is shown mounted on line card 122 at rack 102 while receiver 124 is shown mounted on a line card at rack 112. This transmitter and receiver can be utilized to provide short and intermediate range optical links between the equipment within the CO and specifically such components as optical multiplexers and demultiplexers, and routers. They are inexpensive to fabricate and have data transfer rates in the gigahertz range thus making them suitable for a broad range of applications. The use of an optical link between system components potentially avoids the problems associated with electrical coupling of such components, e.g. RF interference resulting from induction between the RF link (antenna or electrical cable) and other components in the system. A high frequency optical transmitter and receiver are shown that accomplishes this result. Line card 122 may include a plurality of PC boards, including PC board 130. On PC board 130 are mounted a plurality of electronic components 136–138 and the optical transmitter 140. The PC board includes the interfaces 132–134 for bridging to adjacent boards or the backplane. In the embodiment shown component 138 includes a multiplexer for converting several low speed electrical signals from either of interfaces 132–134 to a single high speed signal which can be optically transmitted by transmitter 140. Through either of these interfaces the transmitter may be linked to a router, multiplexer, demultiplexer or other high speed electrical/optical component within CO 98. The optical transmitter 140 is coupled via a ferrule 144 to an optical fiber 150 which links the transmitter to the receiver 170. The receiver is shown mounted on a PC board 160. That PC board also includes electronic components 166–168, as well as interfaces 162–164. The PC board is shown as part of line card 124. In the embodiment shown component 168 includes a demultiplexer for converting the high speed serial data stream to multiple parallel lower bit rate electrical signals which can then be passed via either interface 162–164 directly or across the backplane to a router, multiplexer, demultiplexer, or other high speed electrical/optical components.

Figure 2A:
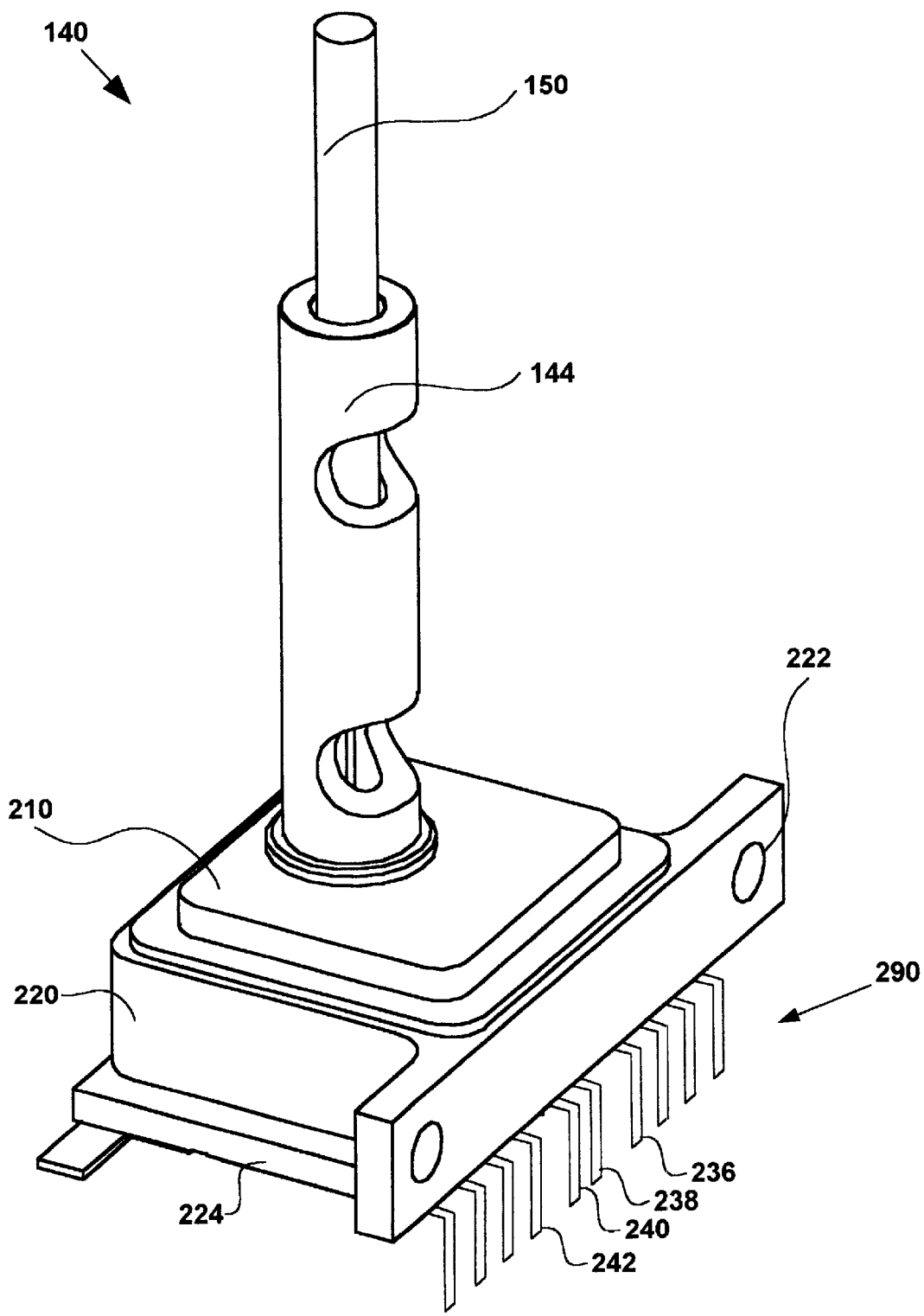
FIG. 2A shows an isometric side assembly view of the optical transmitter shown in FIG. 1.

FIG. 2A is an isometric side view of the transmitter package 140. The fiber optic 150, ferrule 144, lid 210, sidewall 220 and base 224 are shown. The sidewalls include base portion 222. The base includes pin connectors generally 290. Specific pins 236–242 are shown. Pins 236, 242 provide connection to a ground plane which is part of base 224 (see FIGS. 4A–E). Pins 238–240 provide negative and positive differential inputs respectively through the base to driver circuits (not shown) within the transmitter package. Fiber optic 150 is joined to the ferrule 144 using any one of a number of techniques well known to those skilled in the art including: soldering, sintering, compaction of glass frit, bonding with a suitable polymer, etc. In an embodiment of the invention, the various components of the transmitter package, e.g. ferrule 144, lid 210 and sidewalls 220 are fabricated from an electrically conductive material thus providing shielding of the RF circuitry within the transmitter package. In the embodiment of the invention shown in FIG. 2A the fiber and ferrule enter the package through the lid. In an alternate embodiment of the invention the fiber and ferrule may be introduced into the package through an opening defined in one of the sidewalls 220 or the base 224. In still another embodiment of the invention the ferrule is formed as an integral part of either the lid or the sidewall and the fiber is in turn joined with the ferrule.

Figure 2B:
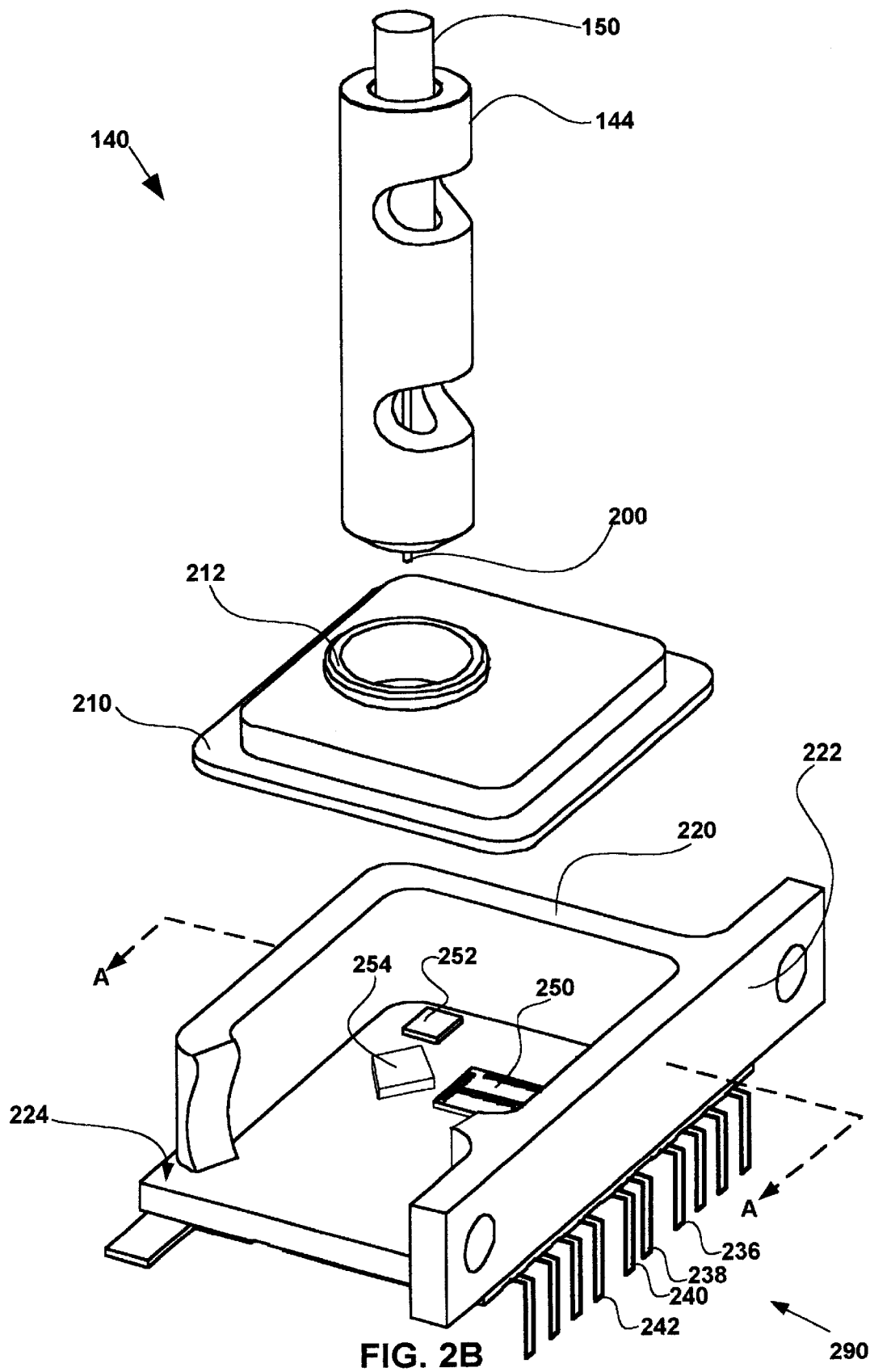
FIG. 2B shows an exploded side isometric assembly view of the optical transmitter shown in FIG. 2A.

FIG. 2B is an exploded isometric side view of the transmitter shown in FIG. 2A. The fiber tip 200 is shown protruding from the proximal end of the ferrule 144. The lid 210 defines within a rim portion 212 thereof, an opening through which the ferrule and fiber is inserted. The tip is positioned proximate a semiconductor laser positioned within the package (see FIGS. 2C–E). A gain medium, e.g. semiconductor laser 254, is mounted on the upper surface of base 224 along with other components such as monitor photodetector 252 and transmitter driver circuitry 250. In an embodiment of the invention the gain medium comprises a vertical cavity surface emitting laser (VCSEL). In an alternate embodiment of the invention the gain medium comprises a conventional slab laser diode which may mounted on a ceramic submount. In an alternate embodiment of the invention the gain medium comprises an external cavity diode laser (ECDL).

Figure 2C:
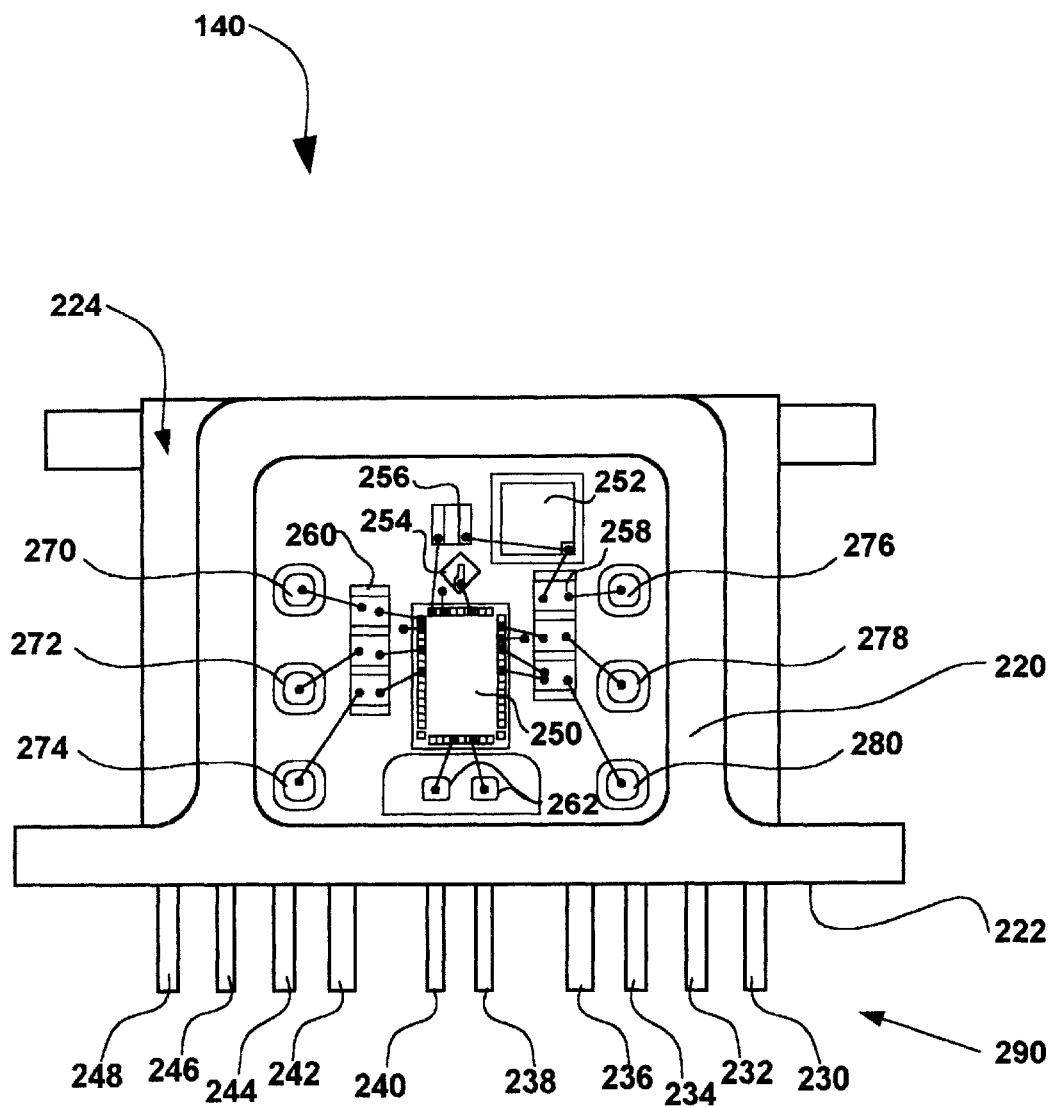
FIG. 2C shows a detailed top view of the component layout within the transmitter package shown in FIGS. 2AB.

FIG. 2C is a detailed layout of the components and connections associated with the transmitter and which are contained within sidewalls 220. Bar capacitors 258–260, transmitter driver 250, gain medium 254, resistor 256, and monitor photo detector 252 are shown. In addition to the ground plane pins 236,242 and the differential input pins 238–240 discussed above, pins 230–234 and pins 244–248 are shown. All pins provide input/output connections to components within the package. Pins 230–234, 244–248 each couple to a corresponding one of pads 270–280. Each of these pads in turn is electrically coupled via a corresponding capacitor on either of bar capacitors 258–260 to a corresponding input on one of the electrical components within the housing. Differential input pins 238–240 couples via differential pads 262 to the transmitter driver 250. The transmitter driver 250 provides drive and modulation current to the gain medium, e.g. laser 254, and accepts closed loop feedback via resistor 256 from monitor photo detector 252. In an embodiment of the invention shown in FIG. 5, the transmitter line driver includes a differential amplifier the inputs of which couple with the differential pads and the output of which couples to the gain medium. The ability to drive the laser with differential input signal avoids the prior art requirement for bulky coaxial connections to shield a single drive signal delivered through the package to the transmitter. The electro magnetic (EM) fields generated by each of the differential signals injected onto the adjacent differential connections tend to cancel one another. By properly dimensioning the differential inputs a controlled impedance input with a limited amount of electromagnetic radiation can be designed.

FIGS. 2D–E are cross-sectional side elevation views of the interior of the package. Details of the optical coupling between the fiber optic 150 and the semiconductor laser 254 are shown. FIG. 2E provides a more detailed view of the coupling between the fiber tip 200 and the laser 254.

Ferrule 144 is inserted through an opening defined in the lid 210 to a location proximate to and within the output beam 292 formed by laser 254. The ferrule is then joined with the lid. Joining methods include soldering, brazing, welding, polymer adhesive, etc. The lid is also joined to the sidewalls utilizing one or more of the above mentioned joining methods. The ground plane portion of the base 224 is also joined to the sidewalls 220 utilizing one or more of the above mentioned joining methods. In an embodiment of the invention where each of the ferrule, lid, sidewalls, and ground plane include electrically conductive materials, an RF shield is thus constructed around the electrical components within the package.

The tip 200 is profiled to define a lens that collimates and/or collects the laser output 292 into output beam 296 within the fiber core 150. In an embodiment of the invention the lens includes at least one of: a convex lens, a conical lens, a parabolic lens, a hyperbolic lens, a ball lens, and a graded index of refraction lens (GRIN). In an embodiment of the invention the fiber optic is a multimode fiber. This fiber has an optically transmissive core that is substantially greater in diameter than a single mode fiber thus relaxing the alignment tolerances between the laser and fiber. In an alternate embodiment of the invention a single mode fiber is utilized with the result that alignment tolerances between the laser and fiber are more stringent. A partially reflective layer 294 is affixed to the tip of the fiber. The material from which this layer is fabricated may include: gold, silver, titanium, and a stack of several dielectric layers. This reflective layer has a number of advantages. First, it serves to decouple a portion of the energy from the laser to limit the energy intensity within the optical fiber to an acceptable range. Second, the partially reflective layer in combination with the geometry of the tip, which is generally aligned at an angle(s) to the laser output beam, reduces spurious reflections or feedback from either the fiber or tip to the laser. This improves the stability and definition of the output beam 292 generated by the laser. Thirdly, the reflective layer reflects a portion of the laser output beam 292 around the interior of the cavity, e.g. sidewalls, lid, and base, until it strikes the monitor photodetector 252. In an embodiment of the invention the interior surfaces of the cavity includes a highly reflective material such as gold or silver. This photo detector provides input to the closed loop feedback circuit (see FIG. 5) for controlling the output power of the gain medium, e.g. laser. The various components within the package cavity are coupled to the PC board via base 224, and pins 290. The base includes an electrically insulating layer 286 sandwiched between upper and lower electrically conductive patterned layers 284,288. Vias 414 connect the corresponding pad and ground plane patterns on the upper and lower electrically conductive patterned layers (See FIGS. 4A–E). This base serves an important role in the overall design of the package and the high frequency components it contains. The base design allows a controlled impedance input connection between the board 130 and the components. The base provides a ground plane which in combination with the sidewalls, lid and ferrule, creates an electrical shield around the RF components within the package, Prior art housings with substantially dielectric housings lack this shielding, and thus can not be placed in close proximity to other components on the board or an opening in the chassis, since to do so would result in unwanted RF coupling and interference.

Figure 3A:
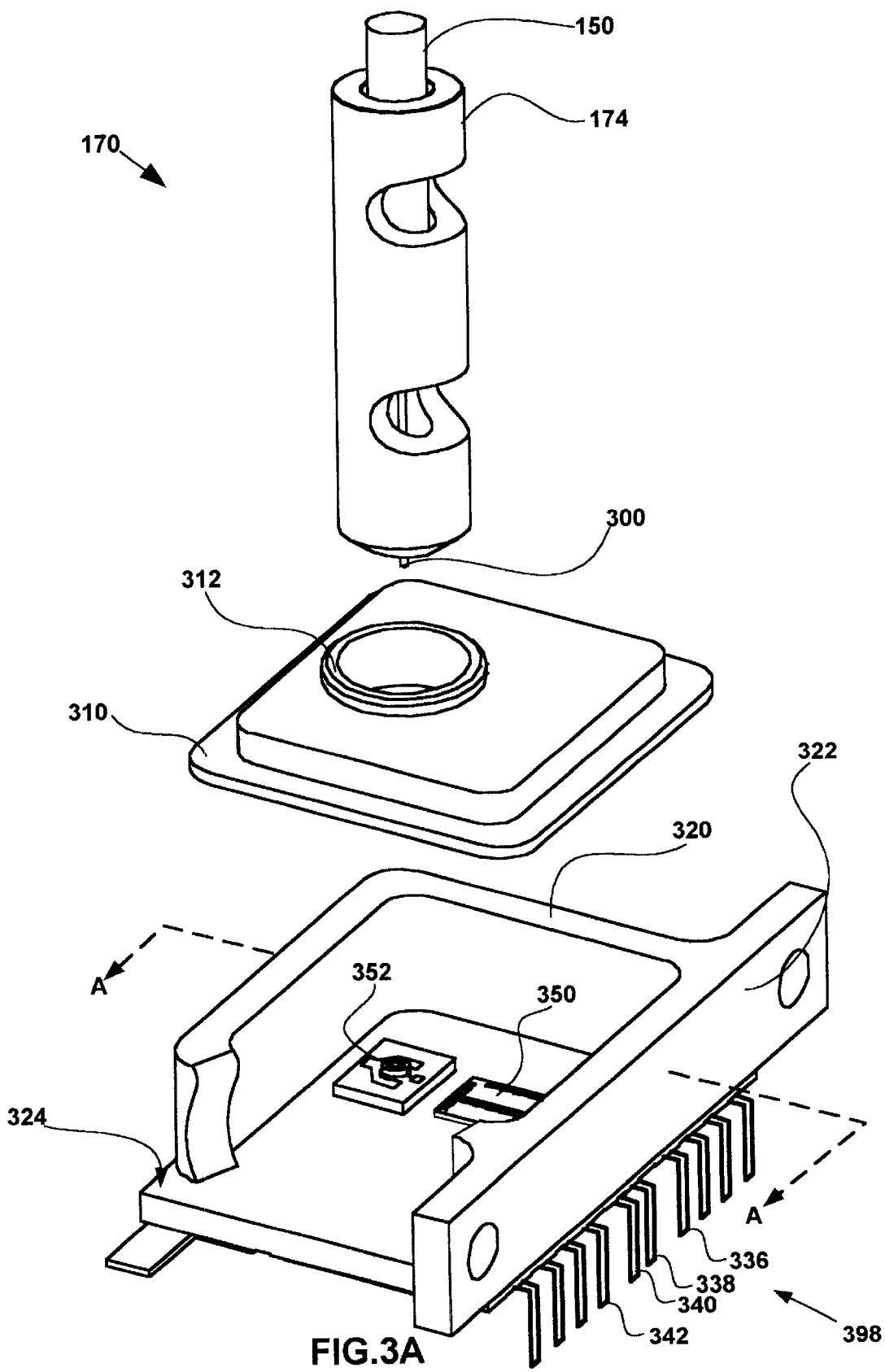
FIG. 3A shows an exploded side isometric assembly view of the optical receiver shown in FIG. 1.

FIG. 3A is an exploded isometric side view of the receiver package 170 shown in FIG. 1. With the exception of the components contained in the package 170 and the lack of a reflective coating on the tip 300 of the fiber optic 150, the package is substantially similar to that shown in FIG. 3A. The fiber tip 300 is shown protruding from the proximal end of the ferrule 174. The lid 310 defines within a rim portion 312 thereof, an opening through which the ferrule and fiber is inserted. The tip is positioned proximate a high speed photodetector 352 positioned within the package (see FIGS. 3B–F). The assembly of this package is similar in technique to that discussed above with respect to the transmitter with the ferrule, lid, sidewalls and base joined to one another to form an RF shield around the high frequency electrical and optical components within the package.

The high speed photodetector is mounted on the upper surface of base 324 along with other components such as a receiver amplifier circuitry 350. Pin connections 338–340 provide controlled impedance differential outputs for the signals received by the photodetector. Pins 336–342 provide connections to the ground plane.

Figure 3B:
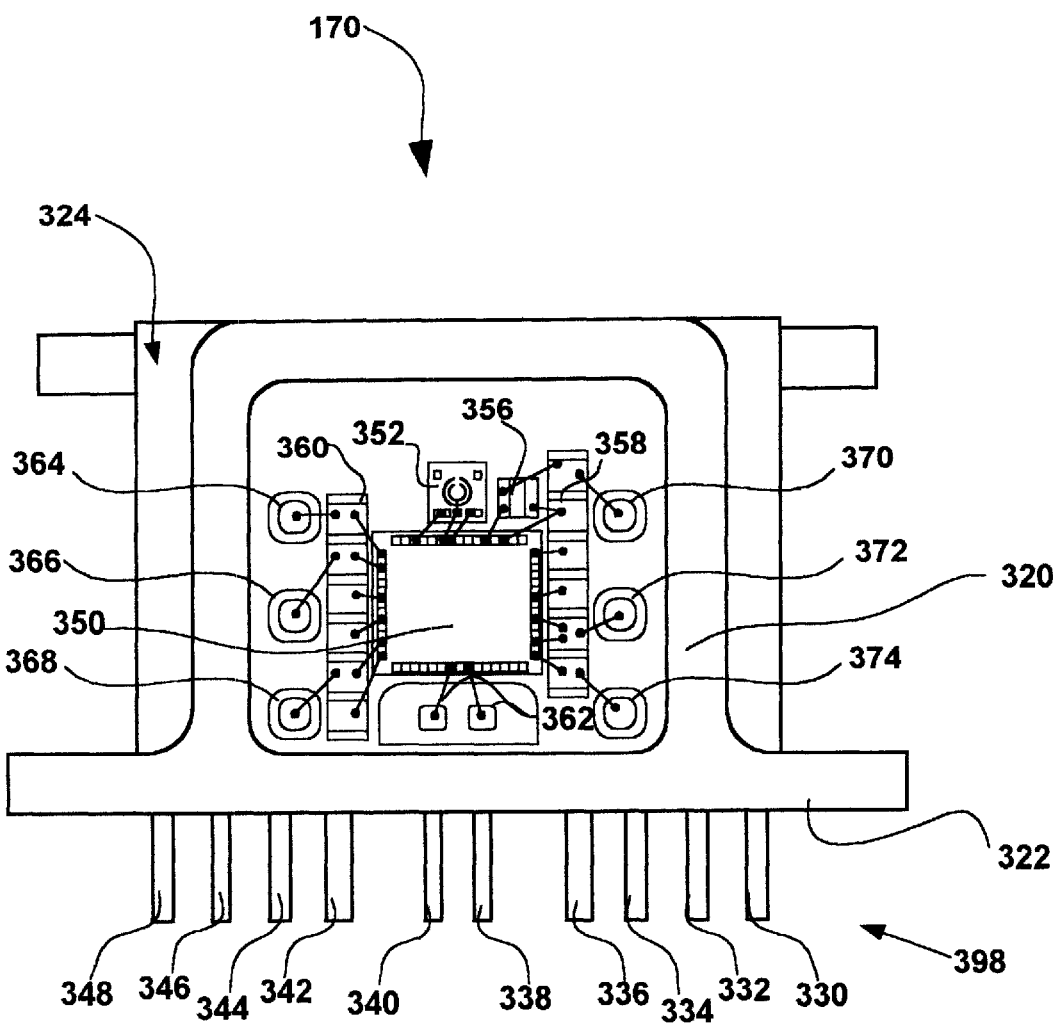
FIG. 3B shows a detailed top view of the component layout within the receiver package shown in FIG. 3A.

FIG. 3B is a detailed layout of the components and connections associated with the receiver and which are contained within sidewalls 320. Those components include bar capacitors 358–360, high speed photodiode 352, resistor 356, and receive circuitry 350. The base includes pin connectors generally 398. In addition to the ground plane pins 336,342 and the differential input pins 338–340 discussed above, pins 330–334 and pins 344–348 are shown. All pins provide connection to components within the package. Pins 330–334, 344–348 each couple to a corresponding one of pads 364–374. Each of these pads in turn is electrically coupled via a corresponding capacitor to either of bar capacitors 358–360 to a corresponding input/output on one of the electrical components within the housing. Differential input pins 338–340 couple via differential pads 362 to the receiver amplifier circuitry 350. This circuitry may provide filtering and pre-processing of the signals generated by the high speed photodetector responsive to incident radiation from the fiber optic 150.

Figure 6:
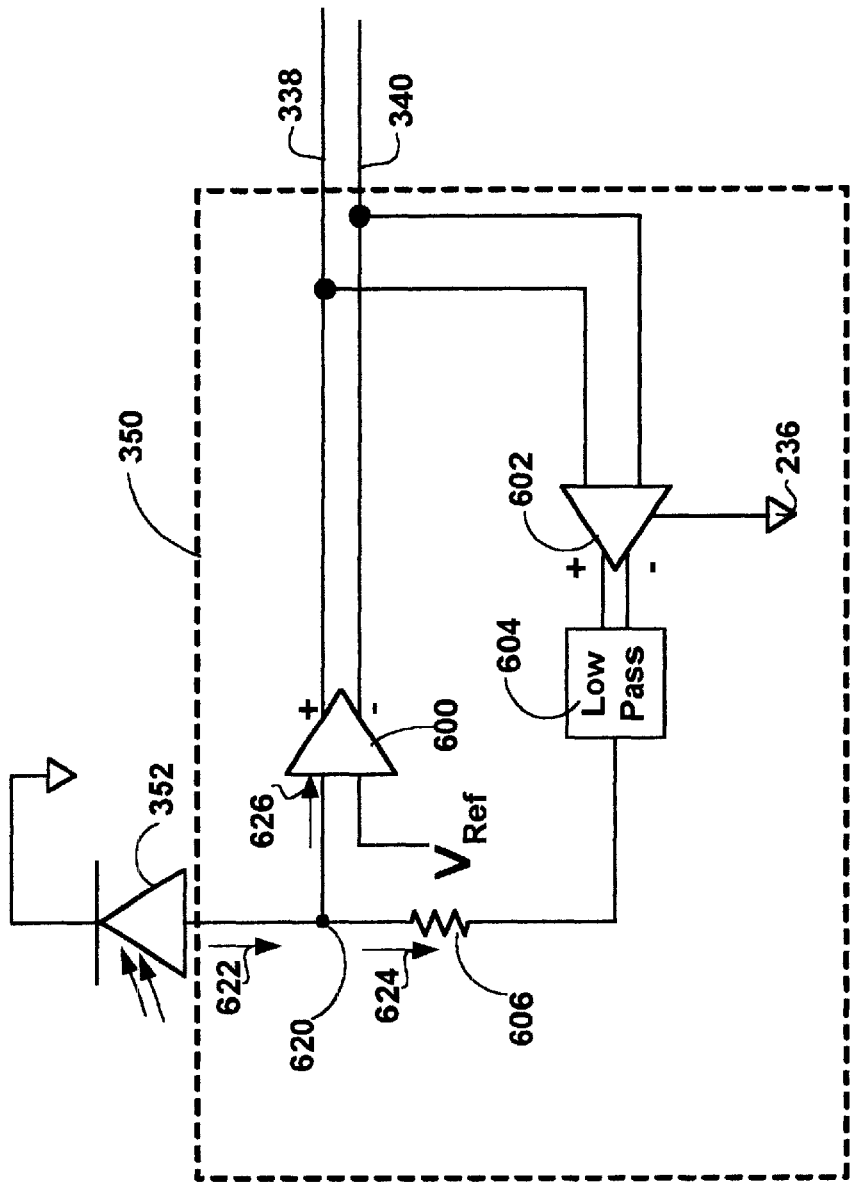
FIG. 6 is a circuit diagram of an embodiment of the receiver circuit shown in FIG. 3B.

In an embodiment of the invention shown in FIG. 6, the receiver amplifier circuitry 350 includes a differential amplifier the outputs of which couple with the differential pads and the input of which couples to the high speed photodetector. The ability to convert the output of the photodetector to a differential output signal within the package and to pass that differential signal via differential pads and pins to the outside world, avoids the prior art requirement for bulky coaxial connections to shield, and deliver with high fidelity, a single receiver signal from the package. The electromagnetic (M) fields generated by each of the differential signals injected onto the adjacent differential connections tend to cancel one another. By properly dimensioning the differential outputs a controlled impedance output with a limited amount of electromagnetic radiation can be designed.

FIG. 3C–F shows greater details of the high speed photodetector 352. The detector is of a PIN type with a lower electrode 378 and a pair of concentric open rings 384–386 that form the top electrode. This detector has several advantages over prior art designs of either a metal semiconductor metal HSM) or a positive, intrinsic, negative implanted semiconductor (PIN) type. In contrast to an MSM type this design has a minimal electrode geometry in the path of the incident radiation, thus improving photodetector efficiency. In contrast to prior art PIN designs, which may define one perimeter ring electrode, this photodetector achieves a higher frequency response by means of a second ring concentric with the outer ring. Either or both of these rings may be opaque or partially transparent. The additional ring substantially reduces the resistance of the electrical contact to the P-type semiconductor layer, thus substantially reducing the electrical RC time constant of the photo detector. Additionally, both rings have a geometry that includes a gap to allow lift-off of the entire portion of the layer complementary to that of the electrodes in one step (See FIGS. 3E–F). This latter feature greatly simplifies fabrication of the device and improves yield, by reducing the uncertainties associated with the extra removal required by prior art designs of the disk formed within prior art ring electrodes.

FIGS. 3C–D are cross-sectional elevation and top views respectively of various details of the high speed photodetector 352. The various semiconductor layers, i.e. "n" doped layer 376, intrinsic layer 380, and "p" doped layer 382 are shown. The exterior upper broken-ring electrode 384 and the interior upper broken-ring electrode 386 are shown on the surface of the "p" doped layer. Electrical connection with these broken-rings is provided by an arm portion 388 of the upper electrode. Both rings are discontinuous being separated in the embodiment shown by a gap 390. The lower electrode 378 provides electrical contact with the "n" doped layer 376.

FIG. 3E is a top view of the lift-off layer from which the upper concentric broken ring electrodes are defined. FIG. 3F is a cross-sectional side view of the mask and lift-off layers from which the upper broken ring electrodes of the high speed photodetector are formed. The lift-off layer 392 from which the upper electrodes are formed may be fabricated from a range of electrically conductive materials, including gold, silver, titanium, and zinc. Where conductivity and transparency is desired, the lift-off layer may be fabricated from a range of materials including: indium tin oxide. The mask layer 394 is used to define the lift-off. The gap 390 defined by the broken-rings allows portions of the lift-off layer between the broken rings and inside the interior ring to be lifted off as a single piece. This greatly reduces fabrication time, and improves yield by allowing a less aggressive lift-off process to be utilized.

Figure 4A:
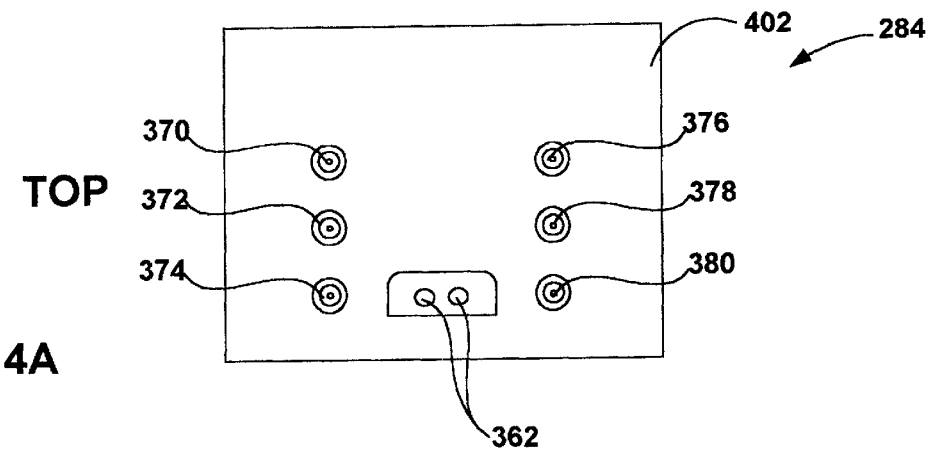
FIGS. 4A is a detailed view of the upper conductive patterned layer of the package base for housing the transmitter, receiver, or other optical components.

FIGS. 4A–E provide detailed views of the multilayer base of the transmitter or receiver packages described above in connection with FIGS. 2–3. FIGS. 4A is a detailed view of the upper conductive patterned layer 402 of the package base for housing the transmitter, receiver, or other optical components. The upper layer includes a ground plane pattern 402, pads 370–380 and differential pads 362. Each pad is electrically isolated from the ground plane by a surrounding void or moat of non-plated area.

Figure 4B:
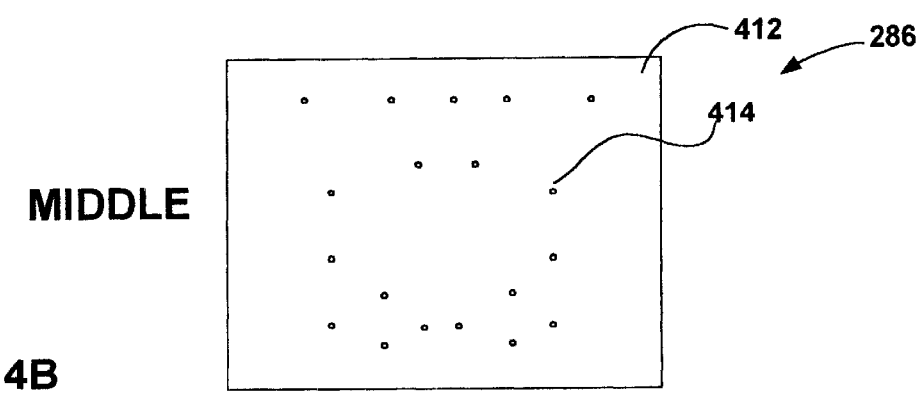
FIG. 4B is a detailed view of the intermediate dielectric layer of the package base.

FIG. 4B is a detailed view of the intermediate dielectric layer 412 of the package base. This layer includes a plurality of electrically conductive vias 414 for electrically coupling corresponding portions of the ground plane and pads of the upper patterned layer shown in FIG. 4A and the lower patterned layer shown in the following FIG. 4C.

Figure 4C:
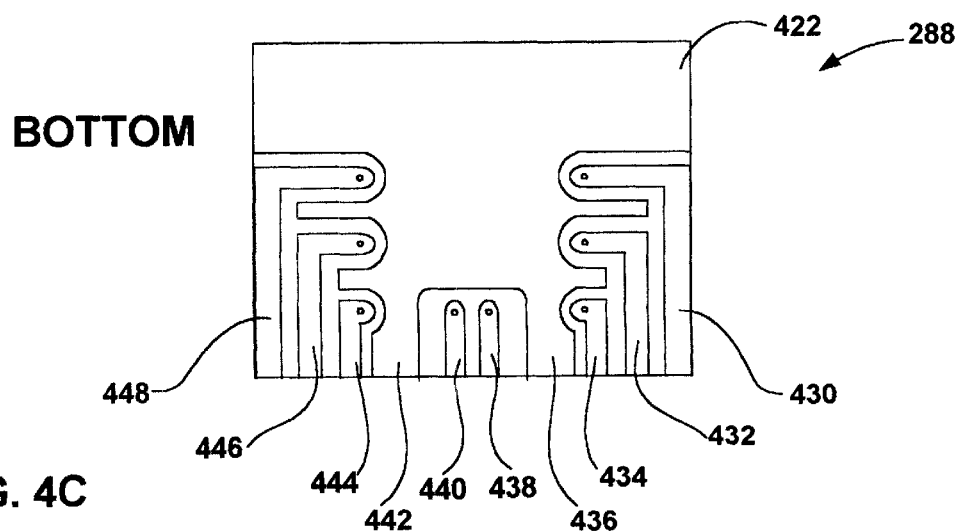
FIG. 4C is a detailed view of the lower conductive patterned layer of the package base.

FIG. 4C is a detailed view of the lower conductive patterned layer of the package base. This layer includes a ground plane pattern 422,436,442; pin pads 430-434, 444-448, and differential pin pads 438-440. Each pad is isolated from the ground plane by a surrounding void or moat of non-plated area that electrically isolates the pads from the ground plane. Vias in the dielectric layer couple the pin pads and differential pads on the lower layer to the pads and differential pads on the upper layer. Vias also couple various portions of the upper and lower ground planes.

Figure 4D:
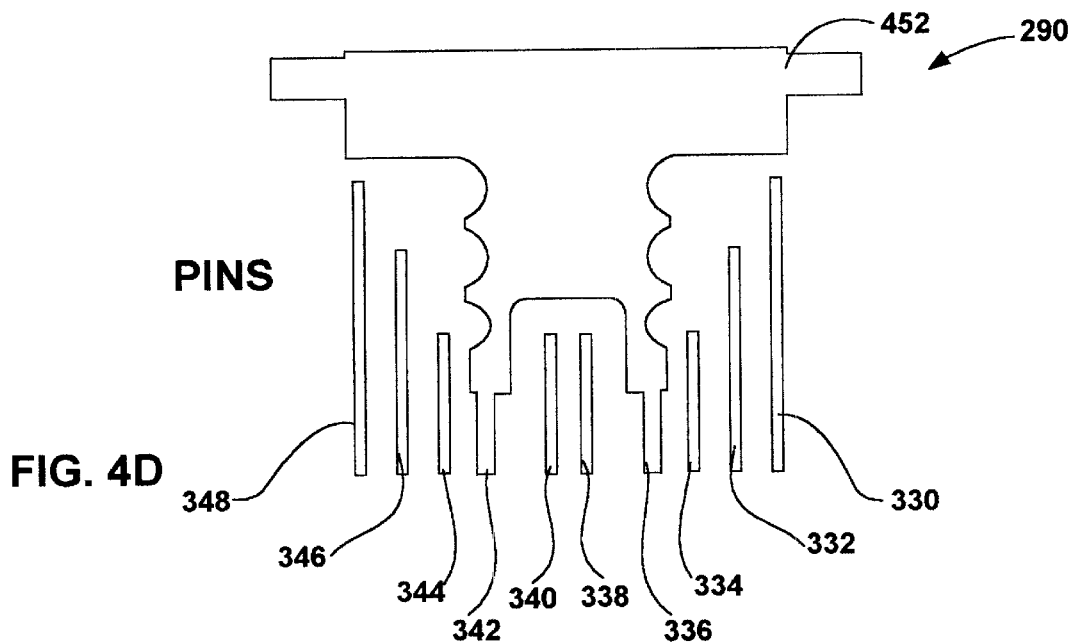
FIG. 4D is a detailed view of the pin and lead frame layer of the package base.

FIG. 4D is a detailed view of the pin and lead frame layer of the package base. This layer forms a protective covering on the lower layer and also provides pin connections with the lower layer. Each of pins 330–348 is electrically coupled to a corresponding one of the pin and differential pads 430–448 on the lower conductive patterned layer shown in FIG. 4C. Lead frame 452 covers the ground plane on the lower layer.

Figure 4E:
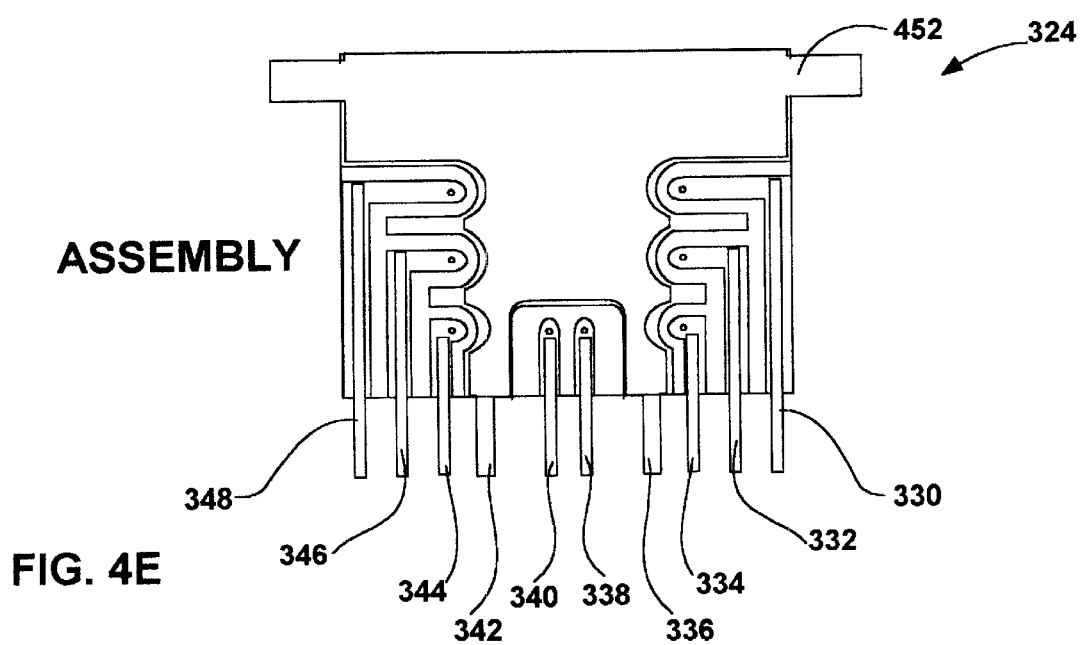
FIG. 4E is an assembly view of the combined layers shown in FIGS. 4A-D.

FIG. 4E is an assembly view of the combined layers shown in FIGS. 4A–D.

The receiver and transmitter have to this point been set forth as separately packaged. In an alternate embodiment of the invention those components can be housed in a single package, with an optical input and output provided by a single duplexed fiber optic connection to the outside world or by two fibers each operating in simplex mode, one coupled to the transmitter and one coupled with the receiver. In the latter embodiment the two fibers may be contained in one ferrule.

The package design set forth in FIGS. 3–4 has maintained the lid and sidewalls as distinct elements. In an alternate embodiment of the invention these components may be combined into a single cover piece. The cover may include an optical coupling such as an optical fiber(s). Alternately, the package may contain a high frequency electrical component with no optical interface.

Reference has been made with respect to both the receiver and the transmitter to a controlled impedance input/output. In an embodiment of the invention, impedance is chosen to match the transmission line characteristic impedance. If for example if the transmission/reception line has a 50-ohm impedance then the differential path through the package should have the same impedance. In order to achieve this result, it is advantageous to use a 3-dimensional electromagnetic simulation package such as Ansoft HFSS™. Careful control of differential lead, trace and ground plane separation, geometries, and aspect ratios at each step along the input or output path is necessary in order to fix impedance at the desired value. Because the permitivity of the surrounding medium is changing along the input/output path, in many instances it will be the case that the above mentioned aspect ratios/parameters will be required to vary along the input/output path in order to obtain a fixed impedance. In an alternate embodiment of the invention controlled impedance may be achieved by implementing the above mentioned design considerations at discrete points along the input/output path eg: leads, trace, via, and pad.

Figure 5:
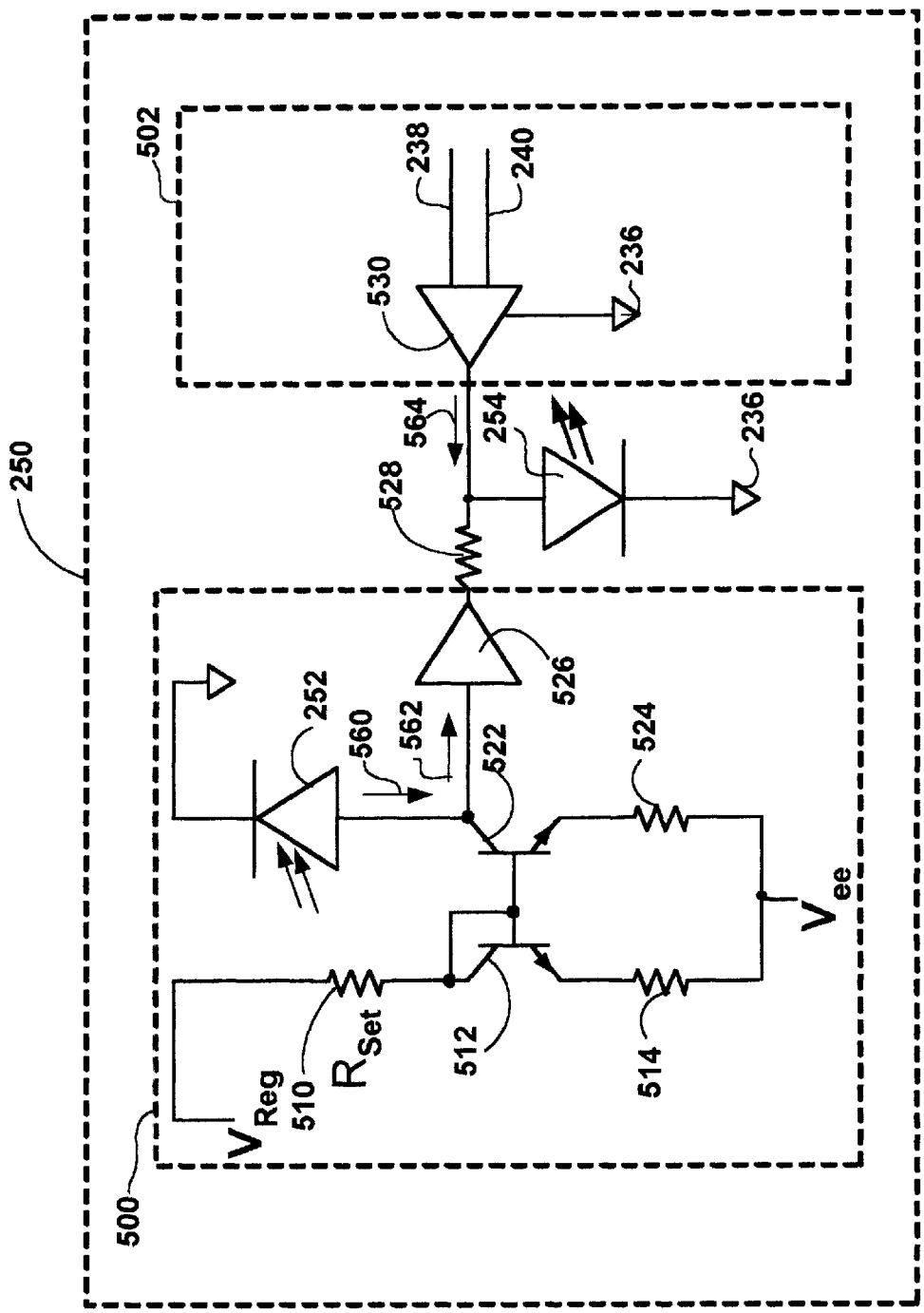
FIG. 5 is a circuit diagram of an embodiment of the transmitter driver shown in FIG. 2C.

FIG. 5 is a circuit diagram of an embodiment of the transmitter driver 250 shown in FIG. 2C. The driver includes a DC or carrier portion 500 and a modulator portion 502. The circuitry in the driver portion maintains a controlled DC power level for the semiconductor laser 254. The modulator provides the digital or analog modulation of the output beam. In the embodiment shown the carrier portion uses a novel control geometry which employs a current mirror to provide a fixed current to the output 522 to which both the monitor photodetector 252 as well as the semiconductor laser 254 are coupled. The current mirror is formed from the cross-coupled transistor pair 512–522. These transistors may be selected from a range of transistor types including but not limited to bipolar junction transistors and field effect transistors. The control gates/base of each transistor is coupled to that of the other. The input to both transistors is delivered from a source $V_{ee}$ through resistors 514, 524. The output of transistor 512 is coupled through a setpoint resistor 510 to an electrical sink with a voltage $V_{reg}$. The output of transistor 512 is also coupled to the control gate/base of both transistor 522 and 512. The output of transistor 522 is coupled to both the monitor photodiode as well as the semiconductor laser. The current to the laser 562, i.e. the drive signal, varies inversely with the current 560 drawn by the photodetector. Thus, as the photodetector draws more current from the output, indicating greater than desired laser output, less is made available to drive the semiconductor laser. As the photodetector draws less current from the output, indicating a less than desired laser output power, more is made available to the semiconductor laser. An amplifier 526 may be utilized to level shift the difference between the output current from the current mirror and the current drawn by the photodetector. This level shifted current then drives the gain medium, e.g. semiconductor laser, setting the DC power level of the emissions generated by the laser. To remove the effect of the high frequency modulation of the output beam on the DC driver circuit, either the monitor photodetector or the amplifier 526 may include a low pass filter. An isolation resistor 528 may be coupled between the output of the amplifier and the input to the semiconductor laser.

The modulator circuit 502 includes a differential amplifier 530. The differential amplifier has differential inputs 238–240 that accept as input an information signal expressed as the difference between the signals on inputs 238–240 and outputs an output signal 564 corresponding to the information signal. This output signal is modulated with the drive signal to insert the information signal on the output emissions from the gain medium, e.g. laser 254.

FIG. 6 is a circuit diagram of an embodiment of the receiver amplifier circuit 350 shown in FIG. 3B. That circuit converts the signal supplied by the high speed photodiode to a differential signal for output on differential signal lines 338–340. That circuit also removes any low-frequency component of the differential signal. This is accomplished by use of a closed loop feedback of the low frequency component of the differential output incorporating a low-pass filter. The receiver amplifier includes: differential amplifier(s) 600, feedback differential amplifier 602, low pass filter 604 and resistor 606. Each differential amplifier has both differential inputs and differential outputs. One input of differential amplifier 600 is coupled to a reference voltage. In the embodiment shown that voltage, $V_{ref}$, is a constant voltage, e.g. −0.8 volts. The other input of the differential amplifier 600 is coupled at node 620 to both the high speed photo detector 352 (See FIG. 3A–D) and via resistor 606 to the output of the low pass filter 604 which is part of the feedback circuit. The differential outputs of the differential amplifier 600 are coupled both to differential signal lines 338–340 and to either of the inputs to the feedback differential amplifier 602. One of the differential outputs of the feedback differential amplifier is coupled to the input of the low pass filter 604. In operation the feedback circuit constantly seeks to remove any low frequency component of the differential output of differential amplifier 600. It does this by drawing the DC level (i.e. low frequency component) of node 620 toward a match condition with that of the other differential input, i.e. $V_{ref}$. By contrast, any high frequency components of the photodetector signal (i.e. the data modulated on the optical signal) are not significantly affected by the feedback circuit since they are removed by the low pass filter 604. Thus the modulation on the differential outputs 338–340 corresponds with the data transmitted. This is passed via differential pins 338–340 (See FIG. 3A–B) to processors, routers and/or demultiplexers for further processing. In an alternate embodiment of the invention there may be multiple stages of differential amplifiers with gain control coupled to the output of differential amplifier 600 to add further gain to the differential data signal.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. An optical receiver, comprising:
   a photo detector defined on a multilayer semiconductor structure, and the photodetector including:
      a) a first electrode formed by at least two substantially concentric conductive rings electrically coupled to one another and to a portion of a first layer of the multilayer semiconductor structure; and
      b) a second electrode coupled to a second layer of the multilayer semiconductor structure, for the transfer of a current generated by the photo detector responsive to optical emissions.
2. The optical receiver of claim 1, further comprising:
   a cover with a lower surface;
   a multilayer base including a dielectric layer between a top layer and a bottom layer, and the top layer and the bottom layer each including an electrically conductive ground plane portion, I/O pad portion, and differential I/O pad portion, with each of the corresponding portions coupled to one another by vias within said dielectric layer; and the multilayer base coupled to the lower surface of the cover and the combined multilayer base, and cover defining an electrically shielded cavity; and the photo detector located within the electrically shielded cavity and differentially coupled electrically though the differential I/O pad portion on the top layer to corresponding differential pad portion on the bottom layer and an RF energy radiated from said electrical component during operation substantially contained within the electrically shielded cavity.
3. The optical receiver of claim 2, further comprising:
   a gain medium for generating an emission along a path;
   an optical fiber extending from a location external to said cover and said multilayer base to a location within the cavity through an opening defined in one of said cover and said multilayer base and the optical fiber optically coupled to said photo detector to supply a first signal thereto and to said gain medium to receive a second signal therefrom.
4. The optical receiver of claim 3, further comprising:
   a reflector on a tip portion of said optical fiber to limit an optical coupling efficiency of said gain medium with said optical fiber.
5. The optical receiver of claim 3, wherein said gain medium comprises at least one of: a vertical cavity surface emitting laser, an external cavity laser and a diode laser.
6. The optical receiver of claim 3, further comprising:
   a differential driver with a positive input, a negative input and an output and the output coupled to the gain medium, and the positive input and the negative input responsive to a differential information signal coupled thereto to vary a level of the emissions of the gain medium to correspond with said differential information signal.
7. The optical receiver of claim 2, further comprising:
   a gain medium for generating an emission along a path;
   a first optical fiber and a second optical fiber each extending from a location external to said cover and said multilayer base to a location within the cavity through an opening defined in at least one of said cover and said multilayer base and said first optical fiber optically coupled to said photo detector to supply a first signal thereto and said second optical fiber optically coupled to said gain medium to receive a second signal therefrom.
8. The optical receiver of claim 2, further comprising:
   a reflector on a tip portion of said second optical fiber to limit an optical coupling efficiency of said gain medium with said second optical fiber.
9. The optical receiver of claim 2, further comprising:
   an optical fiber extending from a location external to said cover and said multilayer base to a location within the cavity through an opening defined in one of said cover and said multilayer base and the optical fiber optically coupled to said photo detector to supply a signal thereto.
10. The optical receiver of claim 9, wherein said optical fiber further comprises one of: a single mode fiber and a multi-mode fiber.
11. The optical receiver of claim 2, further comprising:
   a differential amplifier with a positive input, a negative input and differential outputs and the differential outputs coupled to said top layer of said multilayer base, and one of the positive input and the negative input coupled to an output of said photodetector and an other of said positive input and said negative input coupled to a reference voltage supply.
12. The optical receiver of claim 11, further comprising:
   a differential feedback circuit including:
      a) a feedback differential amplifier with differential inputs and a differential output and the differential inputs coupled with the differential outputs of said differential amplifier; and
      b) a low pass filter with an input an output, and the input of the low pass filter coupled to the differential output of said feedback differential amplifier and the differential output coupled to the one of the positive input and the negative input of differential amplifier coupled to the output of the photodetector to provide feedback to said differential amplifier.

13. The optical receiver of claim 2, further comprising:
a geometry between said differential I/O pad portions on the top layer and differential I/O pad portions on the bottom layer which together with a thickness of the dielectric layer defines a differential interface of a known impedance between an external signal sink and said photo detector.

14. The optical receiver of claim 2, wherein further each of said cover and said multilayer base includes electrically conductive portions which substantially surround the cavity to provide a shield to the RF energy radiated from said electrical component during operation.

15. The optical receiver of claim 2, further comprising:
a plurality of electrical contacts electrically coupled to each of said ground plane portion, I/O pad portion, and differential I/O pad portions of the bottom layer of said multilayer base.

16. The optical receiver of claim 1, wherein said first electrode further defines a gap in a corresponding circumference of each of the at least two substantially concentric conductive rings of said first electrode to facilitate fabrication of the first electrode.

17. The optical receiver of claim 1, wherein said first electrode comprises at least one of: gold, silver, titanium, zinc, and indium-tin-oxide.

18. The optical receiver of claim 1, wherein said photo detector defined on a multilayer semiconductor structure comprises a PIN type.

19. A method for fabricating an optical receiver, and the method for fabricating comprises the acts of:

providing a multilayer semiconductor structure;
forming a first electrode on a first layer of the multilayer semiconductor structure; and
masking a second layer of the multilayer semiconductor semiconductor structure to define within a mask at least two substantially concentric rings with a gap in a circumference of each of the at least two substantially concentric rings;
forming an electrically conductive lift off layer on the mask; and
removing the lift off layer as a single sheet to form a second electrode including at least two substantially concentric conductive rings electrically coupled to one another and to a portion of the second layer of the multilayer semiconductor structure.

20. An optical receiver comprising:
conversion means for converting optical emissions into electricity, the conversion means including:
first substantially circular means for providing electrical contact with a first layer of a semiconductor substrate;
second substantially circular means coupled to the first substantially circular means and for reducing a resistance between the first layer of the semiconductor substrate and the first and second substantially circular means; and
current receiving means coupled to a second layer of the semiconductor substrate and for receiving a current generated in response to the optical emissions.

* * * * *

UNITED STATES PATENT AND TRADEMARK OFFICE
CERTIFICATE OF CORRECTION

PATENT NO.    : 6,364,541 B1
DATED         : April 2, 2002
INVENTOR(S)   : Michael P. Nesnidal, Robert A. Marsland and Robert S. Williamson, III It is certified that error appears in the above-identified patent and that said Letters Patent is hereby corrected as shown below:

Column 1,
Line 3, please insert the following -- This invention was made with Government support under Contract F30602-97-C-0144 awarded by the Air Force. The Government has certain rights in this invention. --

Signed and Sealed this

Thirteenth Day of January, 2004

JON W. DUDAS
*Acting Director of the United States Patent and Trademark Office*